United States Patent
Lang et al.

(10) Patent No.: US 7,786,738 B2
(45) Date of Patent: Aug. 31, 2010

(54) CANCELLING LOW FREQUENCY ERRORS IN MEMS SYSTEMS

(75) Inventors: Christoph Lang, Los Altos, CA (US); Vladimir Petkov, Palo Alto, CA (US); Udo Gomez, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 248 days.

(21) Appl. No.: 11/857,796

(22) Filed: Sep. 19, 2007

(65) Prior Publication Data
US 2009/0072840 A1   Mar. 19, 2009

(51) Int. Cl.
*G01R 27/26* (2006.01)
(52) U.S. Cl. ............................ 324/686; 324/658
(58) Field of Classification Search .......... 324/686, 324/658, 649, 600, 661, 678, 519, 548, 76.11; 323/282, 288
See application file for complete search history.

(56) References Cited
U.S. PATENT DOCUMENTS

| | | | |
|---|---|---|---|
| 4,167,714 A * | 9/1979 | Flora | 333/101 |
| 5,910,781 A * | 6/1999 | Kawamoto et al. | 340/870.37 |
| 6,744,264 B2 * | 6/2004 | Gogoi et al. | 324/658 |
| 6,882,164 B2 * | 4/2005 | Yano et al. | 324/663 |
| 7,385,404 B2 * | 6/2008 | Puma et al. | 324/548 |
| 7,461,553 B2 * | 12/2008 | Lasalandra et al. | 73/514.18 |
| 7,482,816 B2 * | 1/2009 | Odajima et al. | 324/548 |
| 2006/0158202 A1 * | 7/2006 | Umeda et al. | 324/686 |
| 2007/0075710 A1 * | 4/2007 | Hargreaves et al. | 324/658 |
| 2009/0045822 A1 * | 2/2009 | Nosovitsky et al. | 324/686 |

\* cited by examiner

*Primary Examiner*—Hoai-An D Nguyen
(74) *Attorney, Agent, or Firm*—Courtney Staniford & Gregory LLP

(57) ABSTRACT

Systems and methods are described below for cancelling low frequency errors in electronic systems including MEMS systems. The systems include a first circuit coupled to one or more switches. One or more bond wires are coupled to the switches and a second circuit. Control signals are coupled to the switches, and the control signals are configured to control coupling of the first circuit to the second circuit via the switch to cancel variable offsets introduced by the bond wire in an output of the first circuit.

24 Claims, 3 Drawing Sheets

CANCELLING LOW FREQUENCY ERRORS IN MEMS SYSTEMS

TECHNICAL FIELD

The disclosure herein relates generally to micro-electro-mechanical system (MEMS) products. In particular, this disclosure relates to systems and methods for cancelling low frequency errors in MEMS products.

BACKGROUND

Conventional micro-electro-mechanical system (MEMS) products combine two chips into a single integrated package. This two-chip packaging approach includes, for example, one chip that includes the MEMS device or structure (mechanics) and one chip that includes the associated electronics, and the two chips are included in one single package. The two dies that include each of the MEMS and the electronics are connected via wire bonds. The reasons for the two-chip approach include difficulties in monolithically integrating the two components (MEMS and electronics), and the ability to separately optimize the MEMS device and the electronics in order to get the optimum overall yield.

FIG. 1 shows a block circuit diagram of a conventional MEMS device 100, under the prior art. This conventional MEMS device 100 includes a MEMS 110 (e.g., MEMS die) connected to associated electronics 120 (e.g., electronics die). The MEMS 110 is a capacitive accelerometer in which acceleration results in deflection of a movable mass. The deflection to which the package is subjected also results in capacitive changes in the MEMS 110, and the capacitive changes can be sensed by the electronics 120. The sensing capacitors C_S1 and C_S2 of the MEMS 110 change according to the acceleration experienced thereby introducing changes in the signal measured by the electronics. The bond wires 130 that connect the MEMS 110 to the electronics 120 form parasitic capacitances C_PB1 and C_PB2 that are modeled in parallel to the sensing capacitors C_S1 and C_S2. If the bond wires 130 do not change their position and the dielectricum between the bond wires 130 stays constant, the bond wires 130 only add constant capacitances to the sense capacitors. This leads to an offset in the system 100, and conventional systems calibrate for this offset by subtracting a constant value from the output signal of the system.

However, changes in the distance of the bond wires or the dielectric between the bond wires as a result of temperature changes and system age can make accurate system calibration difficult. The parasitic capacitances C_PB1 and C_PB2 being connected in parallel to the sensing capacitors C_S1 and C_S2 make it difficult in conventional systems to adequately compensate or calibrate for the offset drift in the parasitic bond capacitances C_PB1 and C_PB2 resulting from temperature variances and aging. For example, the distance of the bond wires in molded packages changes because of the thermal expansion coefficient of the molded mass of the system, and these changes in distance introduce changes in the parasitic capacitances C_PB1 and C_PB2.

Conventional MEMS systems are unable to compensate for the change of these parasitic capacitances because it is impossible to predict in which direction the bond wires will be deflected. Furthermore, a change of the dielectric between the bond wires (e.g. because of humidity) also introduces changes in the parasitic capacitances C_PB1 and C_PB2. The uncompensated variable offset due to the change of the dielectric between the bond wires can be a major obstacle for new applications of the MEMS (e.g., automobile hill hold control, automobile alarm, etc.). Consequently, there is a need for systems and methods that control the coupling or connection of the MEMS die to the electronics die to eliminate or cancel errors introduced by the bond wire in an output of the MEMS die.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

DETAILED DESCRIPTION

Systems and methods are described below for cancelling low frequency errors in electronic systems. The systems and methods, collectively referred to herein as chopping systems, include a first circuit coupled to one or more switches. One or more bond wires are coupled to the switches and a second circuit. Control signals are coupled to the switches, and the control signals are configured to control coupling of the first circuit to the second circuit via the switch to cancel errors introduced by the bond wire in an output of the first circuit.

More particularly, the chopping systems described below cancel low frequency errors in electronic systems including MEMS. The chopping systems include a sensor including a sensing capacitor, and sensing circuitry configured to receive signals from the sensor. One or more switches are coupled to the sensor. One or more bond wires are coupled to the sensing circuitry and respective ones of the switches. Control signals are coupled to the switch(es), and the control signals are configured to control the switch(es) to eliminate errors in the sensor output resulting from the bond between the sensor and the sensing circuitry. The errors include for example parasitic bond capacitance and offset voltage but are not so limited.

The chopping system described herein allows for accurate calibration of MEMS. The chopping system removes effects of variable offsets and parasitic bond capacitance, thereby allowing for adequate compensation or calibration for the offset drift in the parasitic bond capacitances resulting from temperature variances and aging. Elimination of the effects due to the change of the dielectric between the bond wires effectively removes this as an obstacle for new applications of MEMS.

In the following description, numerous specific details are introduced to provide a thorough understanding of, and enabling description for, embodiments of the chopping systems. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments of the chopping systems.

Figure 1:
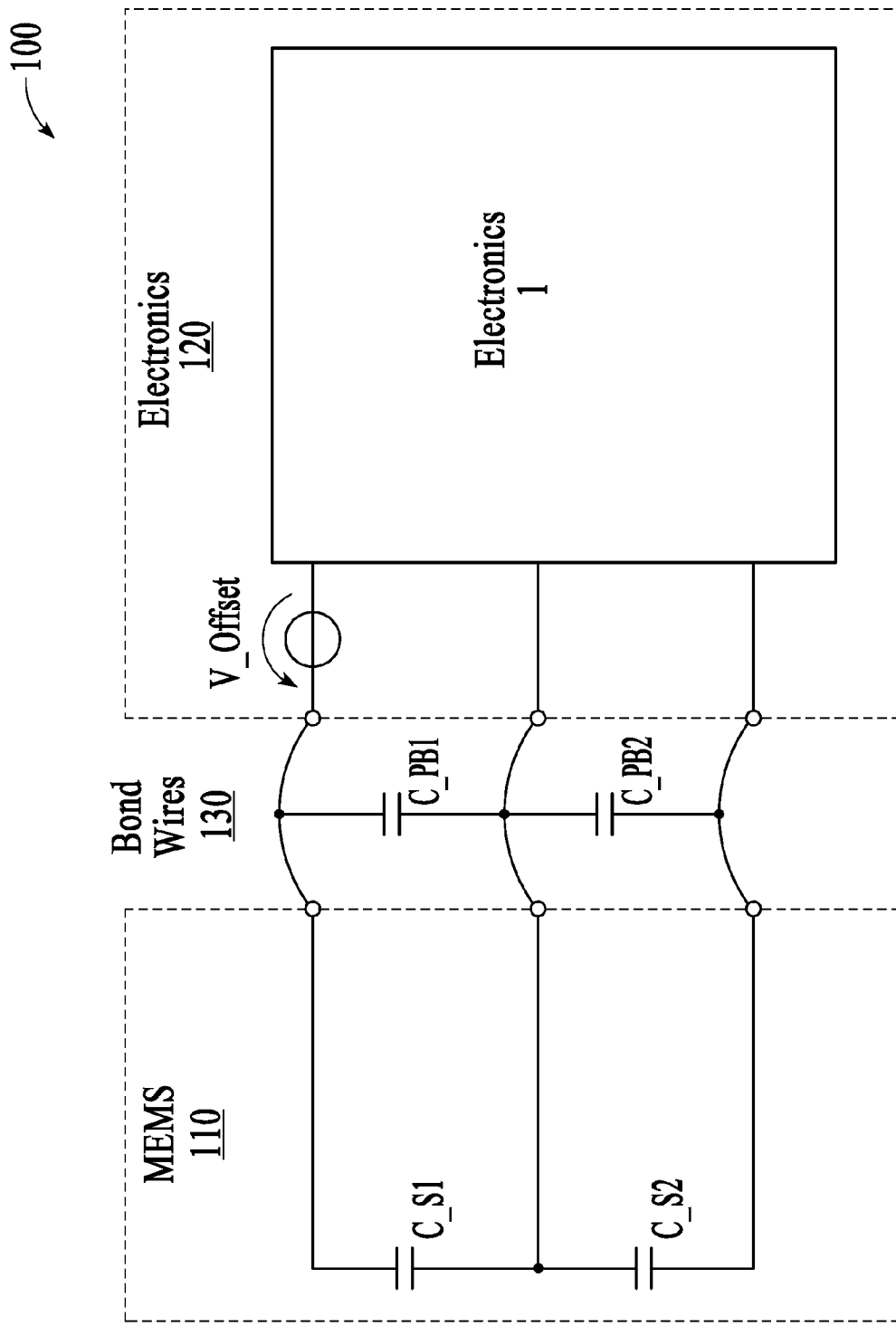
FIG. 1 shows a block circuit diagram of a typical MEMS system, under the prior art.
Figure 2:
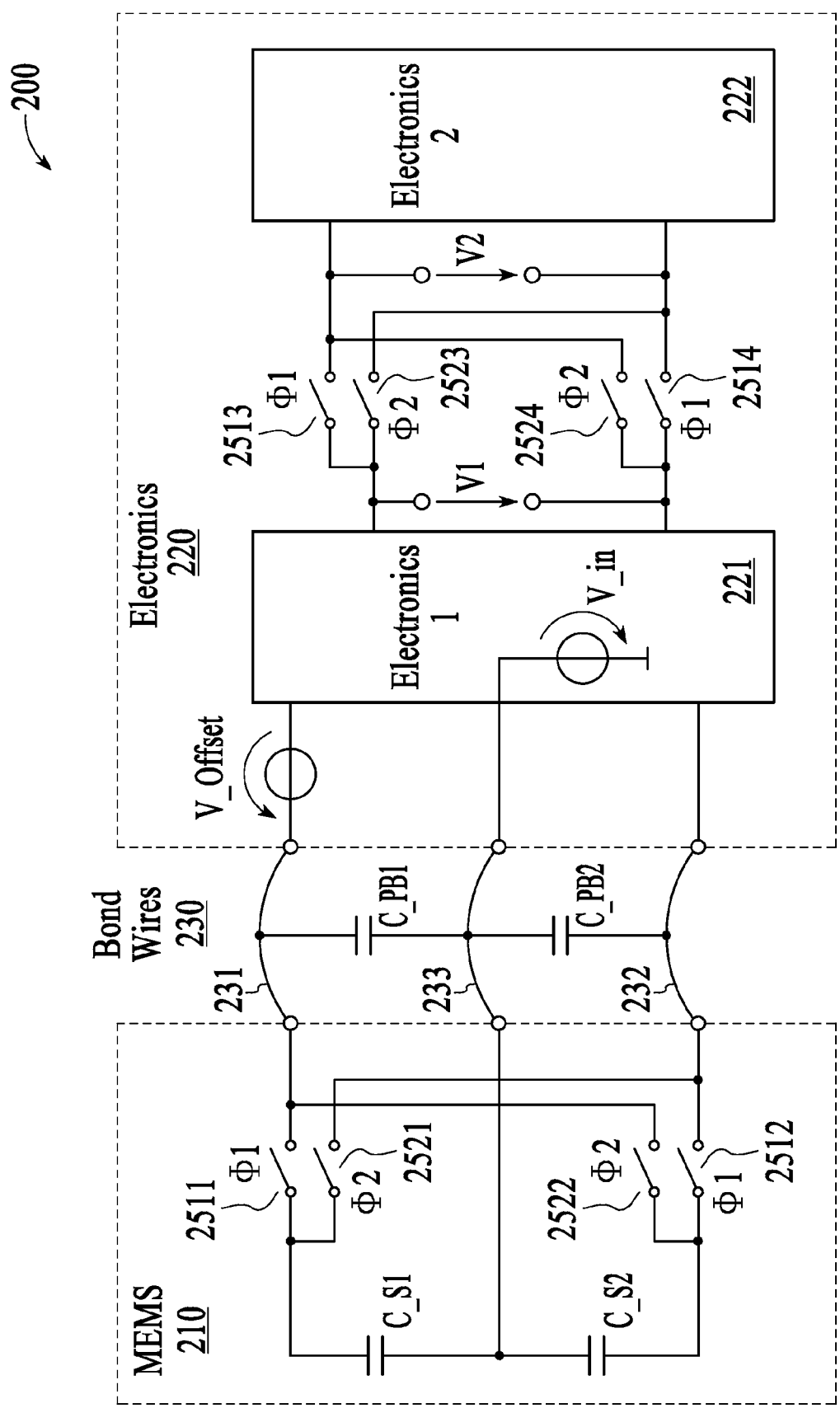
FIG. 2 is a block diagram of an electronic system including the chopping system, under an embodiment.

FIG. 2 is a block diagram of an electronic system 200 including the chopping system, under an embodiment. The electronic system 200, referred to herein as "MEMS," includes a MEMS sensor 210 or component and sensor electronics 220. The MEMS sensor 210 of an embodiment is on a separate die from that of the sensor electronics 220; in alternative embodiments the MEMS sensor can be integrated on the same die as the sensor electronics. The MEMS sensor 210 is a capacitive accelerometer that includes sensing capacitors C_S1 and C_S2 coupled or connected in series. The sensing capacitors C_S1 and C_S2 change according to the acceleration experienced (e.g., acceleration leads to a deflection of a movable mass) thereby introducing changes in the signal measured by the electronics. The MEMS sensor 210 therefore functions to sense deflection to which the package is subjected via capacitive changes, and the capacitive changes are sensed by the sensor electronics.

Bond wires 230 (include bond wires 232, 234, 236) couple or connect the MEMS sensor 210 to the sensor electronics 220. The bond wires 230 that connect the MEMS sensor 210 to the sensor electronics 220 form parasitic capacitances C_PB1 and C_PB2. The parasitic capacitances C_PB1 and C_PB2 are modeled in parallel to the sensing capacitors C_S1 and C_S2.

The bond wires 230 couple the MEMS sensor 210 to the sensor electronics 220 along with one or more switches. The switches of an embodiment include a first set of switches and a second set of switches. The first set of switches includes a first switch 2511 and a second switch 2512. The first switch 2511 of the first set is coupled to a first bond wire 231 and a first conductor or plate of the first capacitor C_S1 of the MEMS sensor 210. The second switch 2512 of the first set of switches is coupled to a second bond wire 232 and a second conductor of the second capacitor C_S2 of the MEMS sensor 210.

The second set of switches also includes a first switch 2521 and a second switch 2522. The first switch 2521 of the second set is coupled to the second bond wire 232 and the first conductor of the first capacitor C_S1 of the MEMS sensor. The second switch 2522 of the second set of switches is coupled to the first bond wire and the second conductor of the second capacitor C_S2 of the MEMS sensor.

The sensor electronics 220 of an embodiment include first circuitry 221 or electronics and second circuitry 222. The MEMS sensor outputs are coupled to the inputs of the first circuitry 221 using the bond wires 230 and the switches 2511-2512 and 2521-2522. Outputs of the first circuitry 221 are coupled to inputs of the second circuitry 222.

The switches of an embodiment also include switches in the coupling or connections between the first circuitry 221 and second circuitry 222. The first set of switches therefore can include a third switch 2513 and a fourth switch 2514. The third switch 2513 of the first set is coupled to a first output of the first circuitry 221 and a first input of the second circuitry 222. The fourth switch 2514 of the first set is coupled to a second output of the first circuitry 221 and a second input of the second circuitry 222.

Similarly, the second set of switches also includes a third switch 2523 and a fourth switch 2524. The third switch 2523 of the second set is coupled to the first output of the first circuitry 221 and the second input of the second circuitry 222. The fourth switch 2524 of the second set is coupled to the second output of the first circuitry 221 and the first input of the second circuitry 222.

As described above, control signals (not shown) are coupled to each of the switches. The control signals are configured to control coupling of the MEMS sensor 210 to the sensor electronics 220 via the switches. The controlled coupling resulting from the switches and control signals results in elimination or cancellation of errors introduced in the sensed output of the MEMS sensor by the bond wire. The control signals are also configured to control coupling of the first circuitry 221 and second circuitry 222 of the sensor electronics 220.

The control signals of an embodiment include a first control signal and a second control signal. The first control signal is coupled to the first set of switches (collectively include either switches 2511-2512 or switches 2511-2514), and is configured to control the first set of switches to a switch state. The second control signal is coupled to the second set of switches (collectively include either switches 2521-2522 or switches 2521-2524) and is configured to control the second set of switches to the switch state. The switch state includes a closed or conductive state and an open or non-conductive state but is not so limited. In an embodiment, the first control signal is configured to control the first set of switches to a state that is opposite a state of the second set of switches. For example, the first control signal places the first set of switches in an open state while the second control signal places the second set of switches in a closed state. As another example, the first control signal places the first set of switches in a closed state while the second control signal places the second set of switches in an open state.

A phase is associated with each of the first and second control signals. As used herein, the control signals include signals having one of two phases $\Phi 1$ and $\Phi 2$. The phase relationship between a phase $\Phi 1$ of the first control signal and a phase $\Phi 2$ of the second control signal of an embodiment eliminates errors (e.g., offset voltage, parasitic capacitance, etc.) introduced in the sensed output of the MEMS sensor by the bond wire. The relationship between the control signals is described in detail below.

Phases $\Phi 1$ and $\Phi 2$ as used herein each represent a time period which repeats with a pre-specified frequency. For example, the system can be clocked with a clocking signal having a frequency of 1 kilohertz (kHz) and a period of 1 millisecond (ms). The period can be divided into two phases ($\Phi 1$ and $\Phi 2$) with each phase being approximately 0.5 ms long.

A switch described herein with reference to phase $\Phi 1$ is closed (conductive) during phase $\Phi 1$. The control signal that is applied to the switch corresponding to phase $\Phi 1$ can be a digital signal, for example; a high logic state (e.g., value "1") of the control signal corresponds to the system being in phase $\Phi 1$.

A switch described herein with reference to phase $\Phi 2$ is closed (conductive) during phase $\Phi 2$. The control signal that is applied to the switch corresponding to phase $\Phi 2$ can also be a digital signal, for example; a high logic state of the control signal corresponds to the system being in phase $\Phi 2$. While the example described herein associates a particular phase with a particular set of switches this only represents an instant in time, and at other instances of time during operations of the MEMS system the phase associated with a set of switches is opposite the phase shown and described in this example.

The MEMS system of an embodiment includes switches clocked by the control signals having phases $\Phi 1$ and $\Phi 2$ as described above. The control signal phases introduce chopping that results in separation from the MEMS sensor output of any offsets introduced by the connection of the MEMS sensor to the sensor electronics. This separation is done in the frequency domain but is not so limited. As a result of this switching scheme, the offsets or errors including, for example, low frequency changes of parasitic capacitances C_PB1 and C_PB2 and the electronic offset voltage V_offset, are separated or canceled.

For purposes of the following example relationship between control signal phases, described with reference to FIG. 2, it is assumed that a switch labeled with phase Φ1 is closed (conductive) during phase Φ1. During phase Φ1 the voltage potential between the outputs of the first circuitry of the sensor electronics is $$V_1 = (\Delta CS \cdot gain_C + \Delta CP \cdot gain_C) \cdot \Delta V_{in}.$$

The variable $\Delta V_{in}$ represents a voltage step applied by the sensor electronics. The variable $\Delta CS$ represents the changes in the sensing capacitance of sensing capacitors C_S1 and C_S2. The variable $\Delta CP$ represents the changes in the parasitic capacitance of parasitic capacitors C_PB1 and C_PB2. The quantity $gain_C$ is a constant set by the ratio of two sensing capacitors C_S1 and C_S2. Therefore, during phase Φ1 the voltage potential between the inputs of the second circuitry of the sensor electronics is $$V_{2,\Phi 1} = V_1$$

During phase Φ2 the voltage potential between the outputs of the first circuitry of the sensor electronics is $$V_1 = (-\Delta CS \cdot gain_C + \Delta CP \cdot gain_C) \cdot \Delta V_{in}.$$

Therefore, during phase Φ2 the voltage potential between the inputs of the second circuitry of the sensor electronics is $$V_{2,\Phi 2} = -V_1.$$

Substituting produces a result as follows $$V_2 = (\Delta CS \cdot gain_C - \Delta CP \cdot gain_C) \cdot \Delta V_{in}.$$

Generating an average of V2 over the phases Φ1 and Φ2 provides a result as follows $$V_{2,average} = (V_{2,\Phi 1} + V_{2,\Phi 2})/2 = \Delta CS \cdot gain_C \cdot \Delta V_{in}.$$

The result of the average of V2 over the phases Φ1 and Φ2 shows that any contribution of parasitic capacitance $\Delta CP$ has been eliminated. Similarly, any contribution of the offset voltage V_Offset that models the input referred offset of the first circuitry of the sensor electronics has been eliminated.

The switches on the MEMS die described herein have a resistance when closed. The resistance of the closed switches is referred to as on-resistance. In a capacitive sensor like the MEMS sensor described above the value of the on-resistance only affects the time constant of the interface between the MEMS die and the electronics die. For example, in time discrete systems the on-resistance would affect the settling time of switched-capacitor amplifiers. Even if the on-resistance was on the order of 1,000 Ohms this would not affect the function of the system configurations described herein. Therefore switches with high on-resistance can be used with relatively little or no impact on the configurations described herein.

Figure 3:
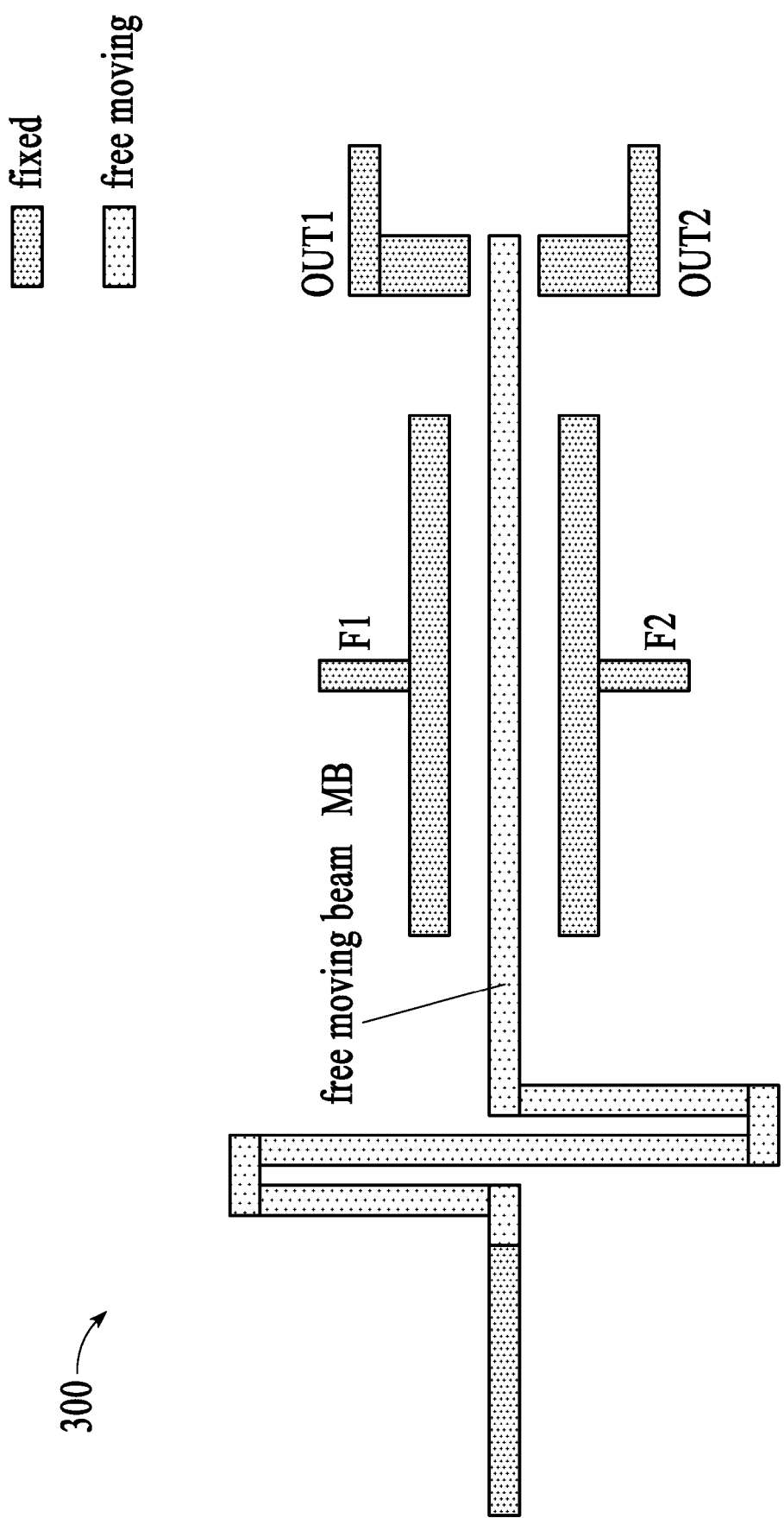
FIG. 3 is a top view of a switch of the chopping system, under an embodiment.

The switches of an embodiment include a relay structure, but are not so limited. FIG. 3 is a top view of a switch 300 of the chopping system, under an embodiment. The MEMS sensor or MEMS die of an embodiment includes the switch 300 but the embodiments are not so limited. The switches 300 can be implemented for example using a MEMS process that uses Poly-Silicon as a structural material.

The switch 300 includes a movable beam MB having a first end that is fixed and a second end that is free and therefore moveable. A central portion or region of the movable beam MB is positioned between two fixed electrodes or terminals F1 and F2. Each of the fixed electrodes F1 and F2 is coupled to an energy source (not shown) described herein as the control signals. The second end of the movable beam MB is positioned between two output terminals OUT1 and OUT2. The output terminals OUT1 and OUT2 include mechanically fixed structures. The second end of the movable beam MB is configured to contact one or the other of the output terminals OUT1 and OUT2 in response to a voltage applied to the fixed electrodes.

In operation, the movable beam MB can be switched between the output terminals OUT1 and OUT2 by applying a voltage between MB and either the first fixed electrode F1 or the second fixed electrode F2. For example if the control signals configure the movable beam MB to connect to output terminal OUT1, the voltage between the movable beam MB and fixed electrode F1 is higher than the voltage between the movable beam MB and fixed electrode F2. This generates a net electrostatic force which pulls the movable beam MB towards output terminal OUT1 until the movable beam MB and output terminal OUT1 make physical contact and the switch 300 is closed. Furthermore, if the control signals configure the movable beam MB to connect to output terminal OUT2, the voltage between the movable beam MB and fixed electrode F2 is higher than the voltage between the movable beam MB and fixed electrode F1. This generates a net electrostatic force which pulls the movable beam MB towards output terminal OUT2 until the movable beam MB and output terminal OUT2 make physical contact and the switch 300 is closed.

The switches of an alternative embodiment include active electronic devices, but are not so limited. As one example, the active electronic devices include but are not limited to transistors. The active electronic devices can be integrated on the MEMS die but are not limited to integration on the MEMS die. For example, the active electronic devices can be integrated in the sensor electronics or on another substrate or device of the system.

The chopping systems of an embodiment include a system comprising a sensor including a sensing capacitor. The system of an embodiment includes sensing circuitry configured to receive signals from the sensor. The system of an embodiment includes at least one bond wire and at least one switch coupled to the sensor and the sensing circuitry. The system of an embodiment includes at least one control signal coupled to the at least one switch and configured to control the at least one switch to separate parasitic bond capacitance of the at least one bond wire from sensing capacitance of the sensor.

The capacitive sensor of the system of an embodiment includes a first capacitor and a second capacitor coupled in series.

The at least one switch of the system of an embodiment includes a first set of switches and a second set of switches.

The first set of switches of the system of an embodiment includes a first switch coupled to a first bond wire and a first conductor of the first capacitor and a second switch coupled to a second bond wire and a second conductor of the second capacitor. The second set of switches of the system of an embodiment includes a third switch coupled to the second bond wire and the first conductor of the first capacitor and a fourth switch coupled to the first bond wire and the second conductor of the second capacitor.

The sensing circuitry of the system of an embodiment comprises first circuitry and second circuitry. The first circuitry of an embodiment is coupled to the at least one bond wire and the second circuitry.

The first set of switches of the system of an embodiment includes a fifth switch and a sixth switch. The fifth switch of an embodiment is coupled to a first output of the first circuitry and a first input of the second circuitry. The sixth switch of an embodiment is coupled to a second output of the first circuitry and a second input of the second circuitry.

The second set of switches of the system of an embodiment includes a seventh switch and an eighth switch. The seventh switch of an embodiment is coupled to the first output of the first circuitry and the second input of the second circuitry. The eighth switch of an embodiment is coupled to the second output of the first circuitry and the first input of the second circuitry.

The at least one control signal of the system of an embodiment includes a first control signal coupled to the first set of switches and a second control signal coupled to the second set of switches.

The first control signal of the system of an embodiment is configured to control the first set of switches to a first state and the second control signal is configured to control the second set of switches to a second state. The first state of an embodiment is opposite the second state.

A phase relationship between the first control signal and the second control signal of the system of an embodiment eliminates one or more of an offset voltage between the sensor and the sensing circuitry and the parasitic bond capacitance.

The at least one switch of the system of an embodiment comprises at least one transistor.

The at least one switch of the system of an embodiment comprises a relay including a movable beam positioned between a plurality of fixed electrodes.

The system of an embodiment includes a first die including the sensor.

The system of an embodiment includes a second die including the sensing circuitry.

Separating the parasitic bond capacitance from the sensing capacitance of an embodiment is a frequency domain separation.

The chopping systems of an embodiment include a system comprising a first circuit coupled to at least one switch. The system of an embodiment includes a bond wire coupled to the at least one switch. The system of an embodiment includes a second circuit coupled to the bond wire. The system of an embodiment includes at least one control signal coupled to the at least one switch. The at least one control signal of an embodiment is configured to control coupling of the first circuit to the second circuit via the switch to cancel a variable offset introduced by the bond wire in an output of the first circuit.

The variable offset of the system of an embodiment includes one or more of parasitic capacitance and offset voltage.

Canceling the variable offset of the system of an embodiment includes separating parasitic bond capacitance of the bond wire from capacitance of the first circuit.

The system of an embodiment includes a third circuit coupled to second circuit via the at least one switch.

The chopping systems of an embodiment include a system comprising a first die including a first circuit. The system of an embodiment includes at least one switch coupled to the first circuit. The system of an embodiment includes a second die including a second circuit. The system of an embodiment includes a bond wire coupled to the at least one switch and the second circuit. The system of an embodiment includes control signals coupled to the at least one switch. The control signals of an embodiment are configured to control a connection of the first circuit to the second circuit via the switch to eliminate offsets introduced in an output of the first circuit by the coupling.

A phase relationship between different ones of the control signals of the system of an embodiment eliminates the offsets including one or more of a parasitic capacitance and an offset voltage.

Aspects of the chopping systems described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the chopping systems include: microcontrollers with memory (such as electronically erasable programmable read only memory (EEPROM)), embedded microprocessors, firmware, software, etc. Furthermore, aspects of the multi-analog receiver front end system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The functions described herein can be performed by programs or sets of program codes, including software, firmware, executable code or instructions running on or otherwise being executed by one or more general-purpose computers or processor-based systems. The computers or other processor-based systems may include one or more central processing units for executing program code, volatile memory, such as RAM for temporarily storing data and data structures during program execution, non-volatile memory, such as a hard disc drive or optical drive, for storing programs and data, including databases and other data stores, and a network interface for accessing an intranet and/or the Internet. However, the functions described herein may also be implemented using special purpose computers, wireless computers, state machines, and/or hardwired electronic circuits.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs including, without limitation, net-list generation programs, place and route programs and the like.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the chopping systems is not intended to be exhaustive or to limit the chopping systems to the precise form disclosed. While specific embodiments of, and examples for, the chopping systems are described herein for illustrative purposes, various equivalent modifications are possible within the scope of the chopping systems, as those skilled in the relevant art will recognize. The teachings of the chopping systems provided herein can be applied to other systems and methods, not only for the chopping systems described above.

The elements and acts of the various embodiments described above can be combined to provide further embodiments. These and other changes can be made to the chopping systems in light of the above detailed description.

In general, in the following claims, the terms used should not be construed to limit the chopping systems to the specific embodiments disclosed in the specification and the claims, but should be construed to include all systems and methods that operate under the claims. Accordingly, the chopping systems are not limited by the disclosure, but instead the scope of the chopping systems is to be determined entirely by the claims.

While certain aspects of the chopping systems are presented below in certain claim forms, the inventors contemplate the various aspects of the chopping systems in any number of claim forms. Accordingly, the inventors reserve the right to add additional claims after filing the application to pursue such additional claim forms for other aspects of the chopping systems.

What is claimed is:

1. A system comprising:
    a sensor including a sensing capacitor comprising a capacitive sensor that includes a first capacitor and a second capacitor;
    sensing circuitry configured to receive signals from the sensor;
    at least one bond wire and at least one switch coupled to the sensor and the sensing circuitry, the at least one switch includes a first set of switches coupled to a first bond wire and a first conductor of the first capacitor and a second bond wire and a second conductor of the second capacitor, and a second set of switches coupled to the second bond wire and the first conductor of the first capacitor and to the first bond wire and the second conductor of the second capacitor; and
    at least one control signal coupled to the at least one switch and configured to control the at least one switch to separate parasitic bond capacitance of the at least one bond wire from sensing capacitance of the sensor.

2. The system of claim 1, wherein the first capacitor and the second capacitor are coupled in series.

3. The system of claim 2, wherein the first set of switches and second set of switches comprise components of a micro-electro-mechanical system (MEMS).

4. The system of claim 3, wherein the first set of switches includes a first switch coupled to the first bond wire and first conductor of the first capacitor and a second switch coupled to the second bond wire and a second conductor of the second capacitor.

5. The system of claim 4, wherein the second set of switches includes a third switch coupled to the second bond wire and the first conductor of the first capacitor and a fourth switch coupled to the first bond wire and the second conductor of the second capacitor.

6. The system of claim 1, wherein the sensing circuitry comprises first circuitry and second circuitry, wherein the first circuitry is coupled to the at least one bond wire and the second circuitry.

7. The system of claim 6, wherein the first set of switches includes a fifth switch and a sixth switch, wherein the fifth switch is coupled to a first output of the first circuitry and a first input of the second circuitry, wherein the sixth switch is coupled to a second output of the first circuitry and a second input of the second circuitry.

8. The system of claim 7, wherein the second set of switches includes a seventh switch and an eighth switch, wherein the seventh switch is coupled to the first output of the first circuitry and the second input of the second circuitry, wherein the eighth switch is coupled to the second output of the first circuitry and the first input of the second circuitry.

9. The system of claim 1, wherein the at least one control signal includes a first control signal coupled to the first set of switches and a second control signal coupled to the second set of switches.

10. The system of claim 9, wherein the first control signal is configured to control the first set of switches to a first state and the second control signal is configured to control the second set of switches to a second state, wherein the first state is opposite the second state.

11. The system of claim 9, wherein a phase relationship between the first control signal and the second control signal eliminates one or more of an offset voltage between the sensor and the sensing circuitry and the parasitic bond capacitance.

12. The system of claim 1, wherein the at least one switch comprises at least one transistor.

13. The system of claim 1, wherein the at least one switch comprises a relay including a movable beam positioned between a plurality of fixed electrodes.

14. The system of claim 1, comprising a first die including the sensor.

15. The system of claim 14, comprising a second die including the sensing circuitry.

16. The system of claim 1, wherein separating the parasitic bond capacitance from the sensing capacitance is a frequency domain separation.

17. The system of claim 1, wherein the sensor includes the first capacitor and second capacitor coupled in series, and the first set of switches includes a first switch coupled to the first capacitor and a second switch coupled to the second bond wire and the second capacitor, and a second set of switches that includes a third switch coupled to the second bond wire and the first capacitor and a fourth switch coupled to the first bond wire and the second capacitor, the sensing circuitry including first circuitry and second circuitry, and the first set of switches further includes a fifth switch coupled to a first output of the first circuitry and a first input of the second circuitry, and a sixth switch coupled to a second output of the first circuitry and a second input of the second circuitry.

18. A system comprising:
a first circuit coupled to at least one switch;
at least one bond wire coupled to the at least one switch, the at least one switch includes a first set of switches coupled to a first bond wire and a first conductor of a first capacitor and a second bond wire and a second conductor of a second capacitor, and a second set of switches coupled to the second bond wire and the first conductor of the first capacitor and to the first bond wire and the second conductor of the second capacitor;
a second circuit coupled to the at least one bond wire; and
at least one control signal coupled to the at least one switch, the at least one control signal configured to control coupling of the first circuit to the second circuit via the switch to cancel a variable offset introduced by the at least one bond wire in an output of the first circuit.

19. The system of claim 18, wherein canceling the variable offset includes separating parasitic bond capacitance of the at least one bond wire from capacitance of the first circuit.

20. The system of claim 18, comprising a third circuit coupled to second circuit via the at least one switch.

21. The system of claim 18, wherein the variable offset includes one or more of parasitic capacitance and offset voltage.

22. A system comprising:
a first die including a first circuit;
at least one switch coupled to the first circuit;
a second die including a second circuit;
at least one bond wire coupled to the at least one switch and the second circuit, the at least one switch includes a first set of switches coupled to a first bond wire and a first conductor of a first capacitor and a second bond wire and a second conductor of a second capacitor, and a second set of switches coupled to the second bond wire and the first conductor of the first capacitor and to the first bond wire and the second conductor of the second capacitor; and
control signals coupled to the at least one switch, the control signals configured to control a connection of the first circuit to the second circuit via the switch to eliminate offsets introduced in an output of the first circuit by the coupling.

23. The system of claim 22, wherein a phase relationship between different ones of the control signals eliminates the offsets including one or more of a parasitic capacitance and an offset voltage.

24. A system comprising:
a sensor including a capacitive sensor that includes a first capacitor and a second capacitor coupled in series;
sensing circuitry configured to receive signals from the capacitive sensor;
at least one bond wire and at least one switch coupled to the sensor and the sensing circuitry, the at least one switch includes a first set of switches that includes a first switch coupled to a first bond wire and a first conductor of the first capacitor and a second switch coupled to a second bond wire and a second conductor of the second capacitor and a second set of switches that includes a third switch coupled to the second bond wire and the first conductor of the first capacitor and a fourth switch coupled to the first bond wire and the second conductor of the second capacitor; and
at least one control signal coupled to the at least one switch and configured to control the at least one switch to separate parasitic bond capacitance of the at least one bond wire from sensing capacitance of the sensor.

* * * * *